United States Patent
Spinti et al.

(10) Patent No.: US 8,060,784 B1
(45) Date of Patent: Nov. 15, 2011

(54) PROGRAMMABLE LOGIC DEVICE AND METHODS FOR PROVIDING MULTI-BOOT CONFIGURATION DATA SUPPORT

(75) Inventors: Roger Spinti, San Jose, CA (US); Howard Tang, San Jose, CA (US); San-Ta Kow, San Jose, CA (US); Ann Wu, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 216 days.

(21) Appl. No.: 12/630,163

(22) Filed: Dec. 3, 2009

Related U.S. Application Data

(63) Continuation of application No. 11/447,591, filed on Jun. 6, 2006, now Pat. No. 7,631,223.

(51) Int. Cl.
*G06F 11/00* (2006.01)
(52) U.S. Cl. .................... 714/36; 715/6.1
(58) Field of Classification Search ........... 714/36, 714/6.1, 27, 52, 725, 724; 713/2, 100
See application file for complete search history.

(56) References Cited

U.S. PATENT DOCUMENTS

| | | | |
|---|---|---|---|
| 7,088,132 B1 * | 8/2006 | Tang et al. | 326/39 |
| 7,091,745 B1 * | 8/2006 | Jacobson | 326/41 |
| 7,095,247 B1 * | 8/2006 | Tang et al. | 326/38 |
| 7,265,578 B1 * | 9/2007 | Tang et al. | 326/40 |
| 7,301,822 B1 * | 11/2007 | Walstrum et al. | 365/189.011 |
| 7,358,762 B1 * | 4/2008 | Walstrum et al. | 326/38 |
| 7,375,549 B1 * | 5/2008 | Tang et al. | 326/38 |
| 7,378,873 B1 * | 5/2008 | Tang et al. | 326/41 |
| 2002/0080771 A1 * | 6/2002 | Krumel | 370/352 |
| 2005/0237083 A1 * | 10/2005 | Bakker et al. | 326/47 |
| 2007/0182445 A1 * | 8/2007 | Chen et al. | 326/39 |
| 2007/0208926 A1 * | 9/2007 | Grieve et al. | 713/1 |

* cited by examiner

*Primary Examiner* — Dieu-Minh Le

(57) ABSTRACT

In one embodiment of the invention, a programmable logic device includes configuration memory and a controller. The controller can read a first bitstream from a first memory block of non-volatile memory and detect whether the first bitstream contains a valid preamble as the first bitstream is read from the non-volatile memory and before configuration data in the first bitstream is programmed into the volatile configuration memory. If a valid preamble is detected in the first bitstream, the controller programs the configuration memory with configuration data in the first bitstream. If a valid preamble is not detected in the first bitstream, the controller reads a second bitstream from a second memory block of the non-volatile memory.

15 Claims, 6 Drawing Sheets

US 8,060,784 B1

PROGRAMMABLE LOGIC DEVICE AND METHODS FOR PROVIDING MULTI-BOOT CONFIGURATION DATA SUPPORT

RELATED APPLICATION DATA

This application is a continuation of U.S. application Ser. No. 11/447,591, filed Jun. 6, 2006, which is incorporated herein by reference in its entirety.

TECHNICAL FIELD

The present invention relates generally to electrical circuits and, more particularly, to the configuration of programmable logic devices.

BACKGROUND

Programmable logic devices (PLDs), such as field programmable gate arrays (FPGAs) or complex programmable logic devices (CPLDs), may be programmed with configuration data to provide various user-defined features. In certain applications, configuration data may be programmed into an external non-volatile memory such as a flash memory. The configuration data may be loaded from the external non-volatile memory into the PLD and programmed into volatile configuration memory of the PLD upon power-up, in response to an appropriate instruction, or in response to the toggling of an appropriate pin of the PLD. When a user desires to change the behavior of the PLD, the external non-volatile memory may be erased and reprogrammed with new configuration data that is subsequently loaded into the PLD.

Unfortunately, the above approach presents several potential problems for reliable PLD operation. Specifically, if the configuration data stored in the external non-volatile memory becomes corrupted or an erroneous configuration data pattern is loaded into the external non-volatile memory, then the operation of the PLD may become inoperable or exhibit unpredictable behavior after the PLD is programmed with the configuration data pattern. Similarly, if an otherwise valid configuration data pattern is improperly programmed or reprogrammed into the PLD or the external non-volatile memory as a result of, for example, a power failure, then the operation of the PLD may be likewise affected. Accordingly, there is a need for an improved approach to the loading of PLD configuration data that, for example, reduces the likelihood of erroneous configuration data being loaded into configuration memory of the PLD.

SUMMARY

In one embodiment of the invention, a method of configuring a programmable logic device includes reading a first bitstream from a first memory block of non-volatile memory and detecting whether the first bitstream contains a valid preamble as the first bitstream is read from the non-volatile memory and before configuration data in the first bitstream is programmed into the volatile configuration memory. If a valid preamble is detected in the first bitstream, the configuration memory is programmed with configuration data in the first bitstream. If a valid preamble is not detected in the first bitstream, a second bitstream is read from a second memory block of the non-volatile memory.

In another embodiment of the invention, a programmable logic device includes configuration memory and a controller. The controller can read a first bitstream from a first memory block of non-volatile memory and detect whether the first bitstream contains a valid preamble as the first bitstream is read from the non-volatile memory and before configuration data in the first bitstream is programmed into the volatile configuration memory. If a valid preamble is detected in the first bitstream, the controller programs the configuration memory with configuration data in the first bitstream. If a valid preamble is not detected in the first bitstream, the controller reads a second bitstream from a second memory block of the non-volatile memory.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

The various techniques disclosed herein are applicable to a wide variety of integrated circuits and applications. As an exemplary implementation, a programmable logic device (PLD) will be utilized to illustrate the techniques in accordance with one or more embodiments of the present invention. However, it should be understood that this is not limiting and that the techniques disclosed herein may be implemented as desired, in accordance with one or more embodiments of the present invention, within various types of circuits.

Figure 1:
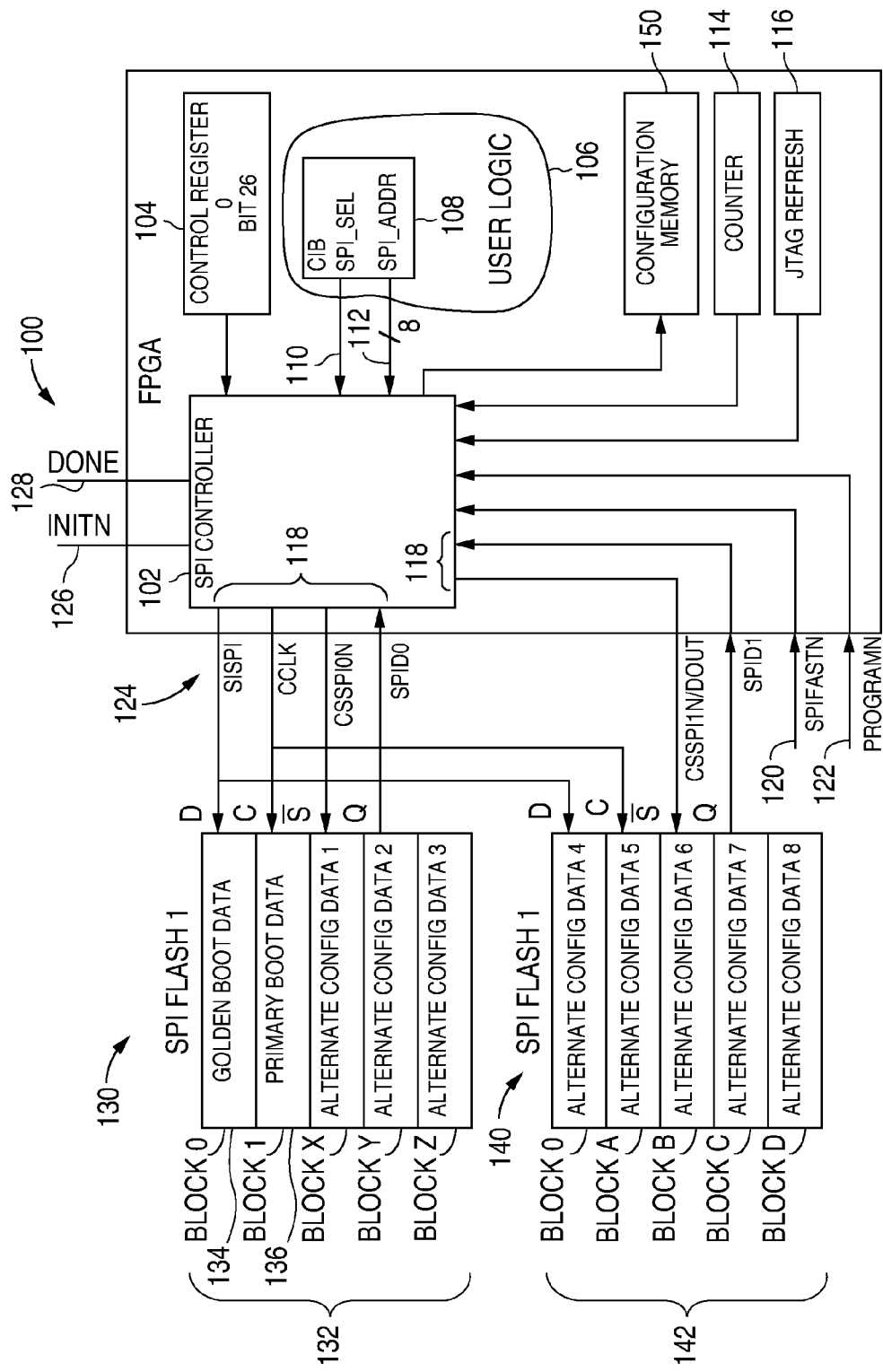
FIG. 1 illustrates a block diagram of an exemplary programmable logic device (PLD) and a plurality of external non-volatile memory devices in accordance with an embodiment of the present invention.

FIG. 1 illustrates a programmable logic device (PLD) 100 which may be implemented as a field programmable gate array (FPGA) as shown in FIG. 1, a complex programmable logic device (CPLD), or other appropriate PLD as may be desired in particular applications.

PLD 100 may be provided in this embodiment of the invention with a Serial Peripheral Interface (SPI) port 124 that is supported by a SPI controller 102 and a plurality of SPI pins 118 and 120 (labeled SISPI, CCLK, CSSPI0N, SPID0, CSSPI1N/DOUT, SPID1, and SPIFASTN) to facilitate interfacing PLD 100 with external SPI-compatible devices. As understood by those skilled in the art, SPI is a serial bus standard established by Motorola Corporation and supported in silicon products from various manufacturers. In other embodiments of the invention, other serial or parallel bus interfaces may be used. SPI pin 120 may configure SPI controller 102 to operate SPI pins 118 at various alternate speeds. For example, in one embodiment, SPI pins 118 may operate at speeds up to approximately 20 MHz if SPI pin 120 exhibits a first logic state, and may operate at speeds in the range of approximately 50-85 MHz if SPI pin 120 exhibits a second logic state. A PROGRAMN pin 122 may be used to trigger a loading of configuration data from an external non-volatile memory as further described herein. SPI controller 102 also supports an INITN pin 126 and a DONE pin 128 which may be used to indicate the configuration status of PLD 100 as further described herein.

PLD 100 also includes a control register 104, a plurality of user logic 106, a common interface block (CIB) 108, a counter 114, and a JTAG block 116, all of which may be used by SPI controller 102 in the loading of configuration data from external SPI-compatible devices. In this regard, control register 104 stores a control bit value set by a user as part of configuration data loaded into PLD 100 and may be used by SPI controller 102 to determine the boot sequence of PLD 100 as further described herein. In one embodiment, control register 104 may be implemented as a 32 bit register with bit 26 providing the control bit value as illustrated in FIG. 1. However, it will be appreciated that other implementations of the control bit are also contemplated using, for example, other bits of control register 104, other registers, and/or other bit storage techniques.

User logic 106 is user-defined logic that is determined by the particular configuration data previously loaded and programmed into PLD 100. CIB 108 facilitates the interfacing of user logic 106 with SPI controller 102 through a SPI_SEL signal 110 and a SPI_ADDR bus 112 which may be determined by user logic 106. Counter 114 is used by PLD 100 during its boot sequence to aid PLD 100 in determining whether configuration data has been properly loaded into PLD 100. JTAG block 116 provides a refresh instruction to SPI controller 102 which may be received through a JTAG port of PLD 100.

As illustrated, SPI pins 118 may interface with devices external to PLD 100, such as for example SPI memories 130 and 140 (i.e., through standard SPI pins labeled D, C, $\overline{S}$, and Q as shown in FIG. 1). Each of SPI memories 130 and 140 may be implemented as non-volatile memories (for example, flash memories, EEPROMs, EPROMs, PROMs, or ROMs) and may include a plurality of memory blocks 132 (labeled Block 0, 1, X, Y, and Z) and 142 (labeled Block 0, A, B, C, and D), respectively. Each of memory blocks 132 and 142 may store a configuration data pattern which may be loaded into PLD 100 through the use of SPI pins 118 and programmed into configuration memory 150 (for example, volatile SRAM memory) of PLD 100. In one embodiment, individual memory blocks 132 and 142 of SPI memories 130 and 140 may comprise approximately 512 Kbytes.

It will be appreciated that other embodiments of the invention may include other serial or parallel bus interfaces and their compatible serial and parallel non-volatile memories.

For example, Block 0 of SPI memory 130 holds configuration data referred to as golden boot data 134 (also referred to as default boot data) that, when programmed into configuration memory 150 of PLD 100, will cause PLD 100 to operate in a known stable state. Block 1 of SPI memory 130 holds configuration data referred to as primary boot data 136 that may be loaded upon power up of PLD 100. This block may also be selectively erased and reprogrammed by a user, thereby allowing PLD 100 to be reconfigured with an updated version of primary boot data 136 when powered up. The remaining blocks of SPI memories 130 and 140 may optionally hold various alternate sets of configuration data which may also be erased, reprogrammed, and/or selected for loading into PLD 100.

PLD 100 may be implemented to load primary boot data 136 of Block 1 when PLD 100 is powered on. If primary boot data 136 of Block 1 fails to properly load (for example, as a result of a power failure during loading or corruption of primary boot data 136 occurring during erasure or reprogramming of SPI memory 130), SPI controller 102 may automatically load a default set of golden boot data 134 from Block 0 of SPI memory 130. Advantageously, such an implementation can provide PLD 100 with the opportunity to return to a known operable state in the event of such failures.

Figure 2A:
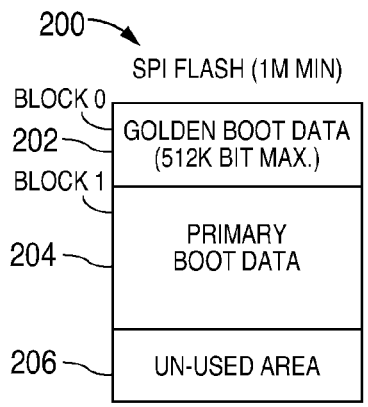
FIGS. 2A-D illustrate block diagrams of alternative embodiments of the external non-volatile memory devices of FIG. 1.

Various other configurations of SPI memories 130 and 140 are also contemplated as illustrated in the block diagrams of FIGS. 2A-D. It will be appreciated that the various SPI memories illustrated in FIGS. 2A-D may be implemented as various alternate embodiments of SPI memory 130 and 140 previously described with regard to FIG. 1. For example, FIG. 2A illustrates a SPI memory 200 implemented with a minimum of approximately 1 Megabyte of flash memory. Golden boot data 202, having a maximum of approximately 512 Kbytes, is stored in Block 0 and primary boot data 204 is stored in Block 1. The remaining memory space 206 of SPI memory 200 may be unused.

Figure 2B:
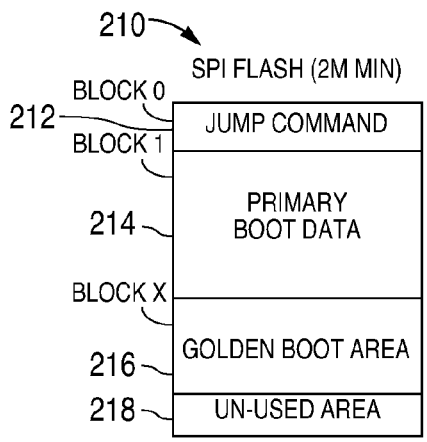

FIG. 2B illustrates a SPI memory 210 implemented with a minimum of approximately 2 Megabytes of flash memory. Block 0 of SPI memory 210 is configured to store a JUMP command 212 which references golden boot data 216 stored in Block X of SPI memory 210. Block 1 of SPI memory 210 stores primary boot data 214 which may span Block 1 through additional blocks (not shown) up to Block X. In this regard, it will be appreciated that in embodiments where each of primary boot data 214 and golden boot data 216 exceed the size of a single memory block (for example, larger than 512 Kbytes), then golden boot data 216 may be stored at Block X to allow primary boot data 214 to be stored in Block 1. As illustrated, any remaining memory space 218 of SPI memory 210 may be unused.

Figure 2C:
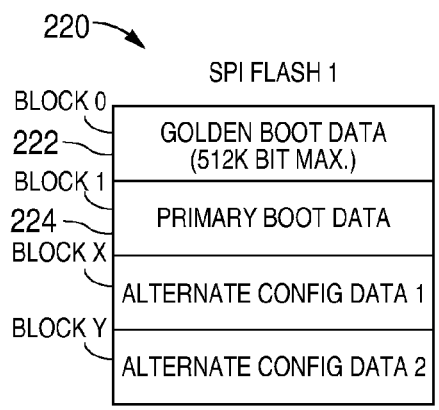
Figure 2C:
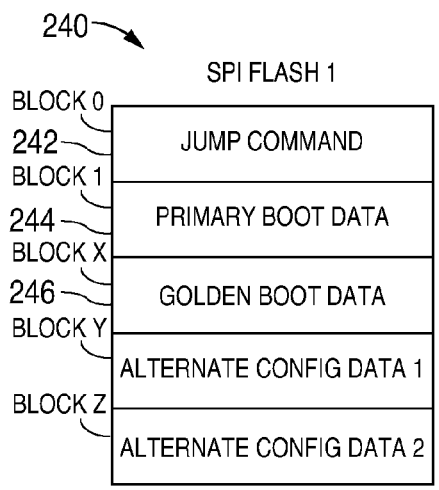

FIG. 2C illustrates SPI memories 220 and 230 each implemented with a minimum of approximately 2 Megabytes of flash memory. Similar to SPI memory 130 of FIG. 1 and SPI memory 200 of FIG. 2A, Block 0 of SPI memory 220 is configured to store golden boot data 222 having a maximum of approximately 512 Kbytes. Primary boot data 224 is stored in Block 1. Various alternate configuration data patterns are stored in the remaining Blocks X and Y of SPI memory 220 and optionally in Blocks 0, A, B, and C of SPI memory 230. Similar to SPI memories 200 and 210 described above, one or both of SPI memories 220 and 230 may also include unused memory space in any of the various memory blocks illustrated in FIG. 2C.

Figure 2D:
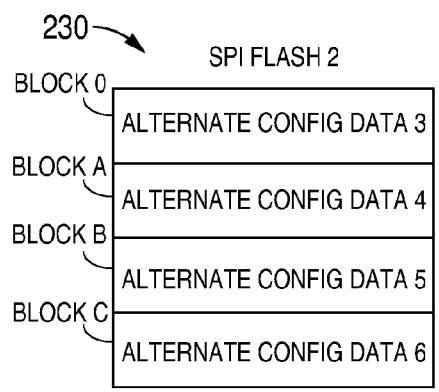
Figure 2D:
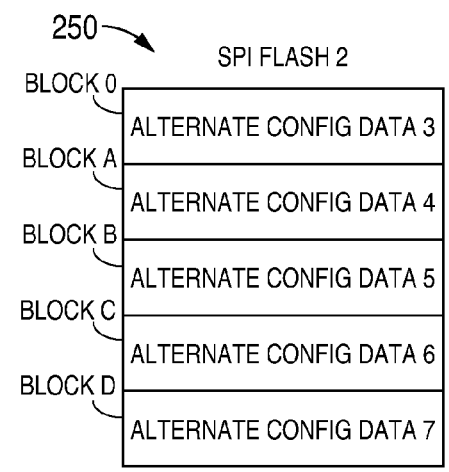

FIG. 2D illustrates SPI memories 240 and 250 each implemented with a minimum of approximately 2 Megabytes of flash memory. Similar to SPI memory 210 of FIG. 2B, Block 0 of SPI memory 240 is configured to store a JUMP command 242 which references golden boot data 246 stored in Block X of SPI memory 240. Block 1 of SPI memory 240 stores primary boot data 244 which may span Block 1 through additional blocks (not shown) up to Block X. Alternate configuration data patterns are stored in the remaining Blocks Y and Z of SPI memory 240 and optionally in Blocks 0, A, B, C, and D of SPI memory 250. Similar to SPI memories 200, 210, 220, and 230 described above, one or both of SPI memories 240 and 250 may also include unused memory space in any of the various memory blocks illustrated in FIG. 2D.

Figure 3A:
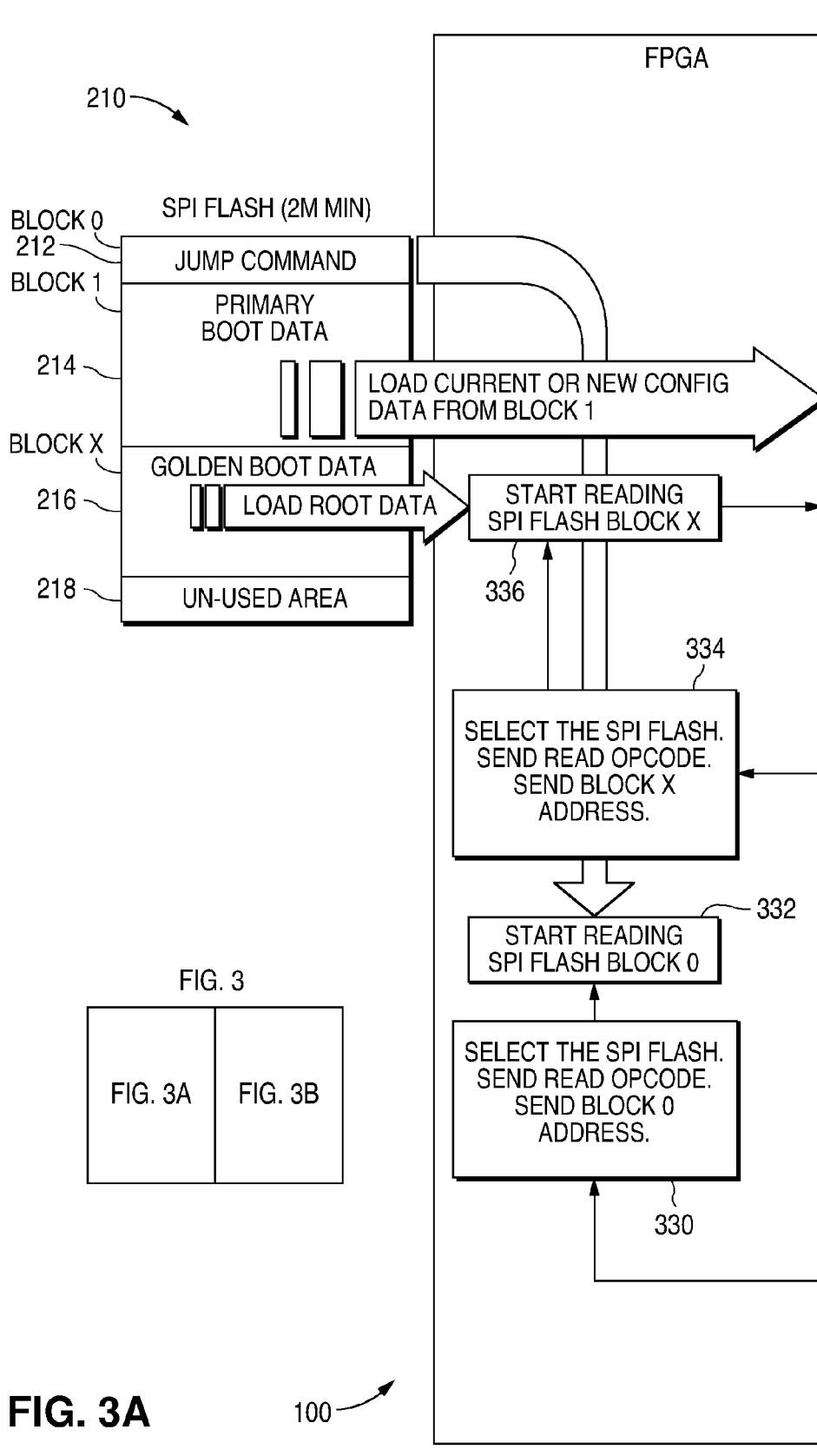
FIG. 3 illustrates a process of loading configuration data into the PLD of FIG. 1 in response to a power on reset operation in accordance with an embodiment of the present invention.
Figure 3B:
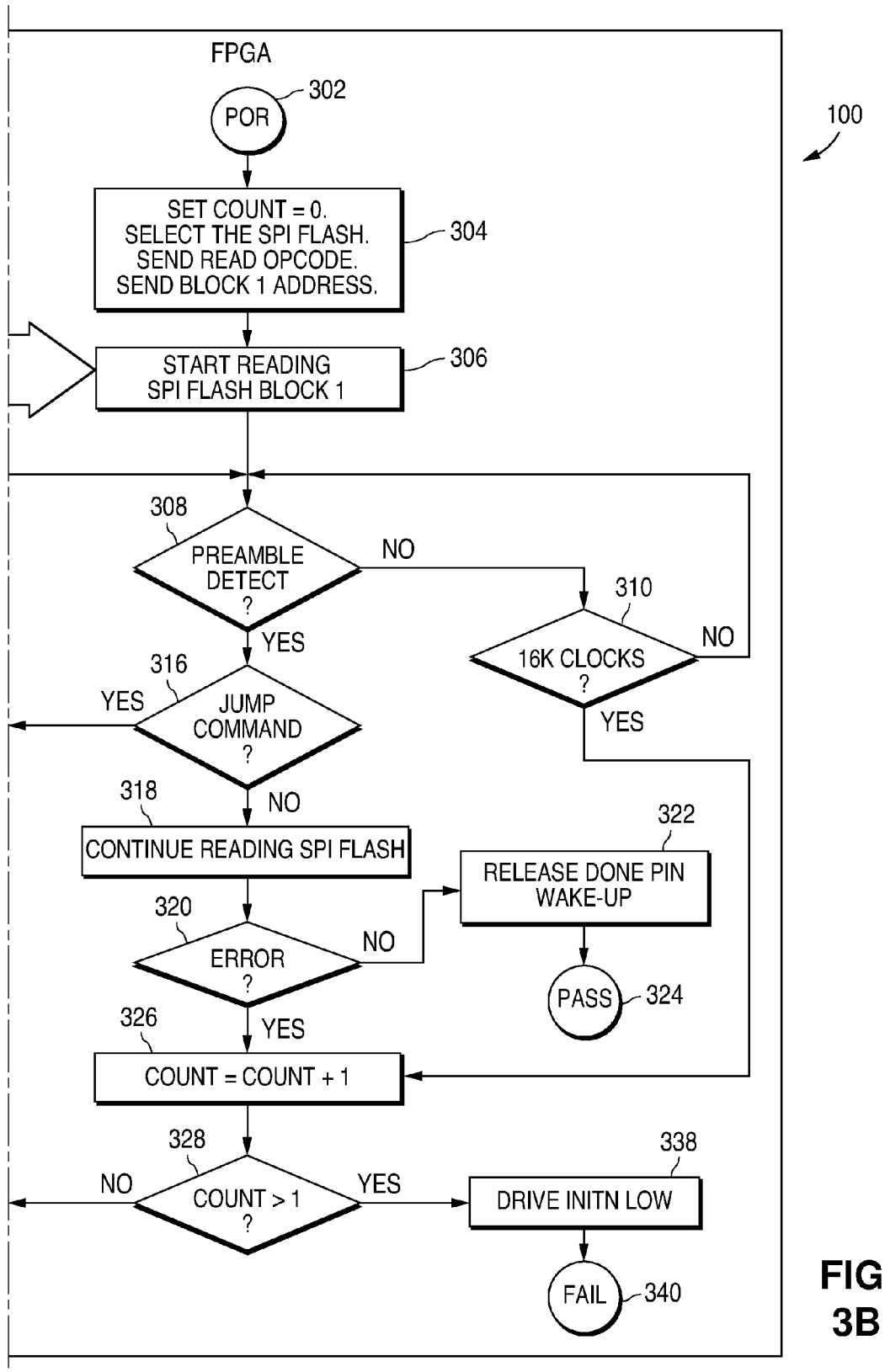

FIG. 3 illustrates a process of loading configuration data into PLD 100 in response to a power on reset operation in accordance with an embodiment of the present invention. As further described herein, FIG. 3 sets forth an iterative process that may be implemented by PLD 100 to attempt the loading of appropriate configuration data from different blocks of SPI memory 210. Specifically, PLD 100 first attempts to load a set of primary boot data from a particular memory block. If errors are encountered during loading, then PLD 100 attempts to load a set of golden boot data from a default memory block. PLD 100 may also load the set of golden boot data from another memory block if instructed by an appropriate command detected in the default memory block. Although the process of FIG. 3 will be described with reference to SPI memory 210, it will be appreciated that SPI memory 200 of FIG. 2A may be used in an alternate embodiment.

Turning now to the particulars of FIG. 3, a power on reset (FOR) operation is performed on PLD 100 at initial operation 302. In this regard, PLD 100 may initially be in an unpowered state prior to the process of FIG. 3, and then be powered up in response to operation 302.

In operation 304, counter 114 is set to zero, and SPI controller 102 sends a plurality of signals to SPI memory 210 over SPI pins 118. Specifically, SPI controller 102 may provide a chip select signal from one of SPI pins 118 labeled CSSPI0N in order to select SPI memory 210. SPI controller 102 may also provide a read opcode and a memory address corresponding to the beginning of Block 1 in a serial fashion from one of SPI pins 118 labeled SISPI. In this regard, SPI controller 102 may be implemented to permanently store the address of Block 1. As previously described, Block 1 of SPI memory 210 may hold primary boot data 214 which may be loaded into PLD 100 in order to configure PLD 100 upon power up. Accordingly, following operation 304, PLD 100 may attempt to read in primary boot data 214 (also labeled Current or New Config Data) from SPI memory 210 (operation 306). It will be appreciated that primary boot data 214 may be loaded as a serial bitstream provided to SPI controller 102 over one of SPI pins 118 labeled SPID0. It will be further appreciated that where PLD 100 is implemented with a parallel bus interface, data may be loaded as a parallel bitstream (for example, with simultaneous loading of 8 data bits at a time through the parallel bus interface).

In operation 308, SPI controller 102 detects whether a configuration data preamble has been received from SPI memory 210. In this regard, SPI controller 102 may be configured to recognize a particular sequence of bit values (for example, a 16 bit opcode) that is included at the beginning of a valid configuration data bitstream. If no preamble is detected, then SPI controller 102 continues to wait for up to 16K clock cycles (operation 310) until a valid preamble is received. If no preamble is received, then SPI controller 102 may assume that SPI memory 210 is erased or non-responsive. As a result, the process of FIG. 3 will continue on to operation 326 further described herein.

However, if a valid preamble is detected in operation 308, then SPI controller 102 will next determine whether the configuration data read in previous operation 306 corresponds to a JUMP command (operation 316). As previously described, JUMP command 212 may be provided in Block 0 of SPI memory 210 which references Block X where golden boot data 216 is stored.

If, as illustrated in FIG. 3, Block 1 of SPI memory 210 includes primary boot data 214 which was read in operation 306, then no JUMP command will be found and the process of FIG. 3 will continue on to operation 318. If a JUMP command is detected in operation 316, then the process will proceed to operation 334 as further described herein.

In operation 318, PLD 100 continues reading primary boot data 214 and begins configuring PLD 100 by programming configuration memory 150 of PLD 100 with primary boot data 214. In operation 320, PLD 100 checks incoming primary boot data 214 for errors. For example, in one embodiment, operation 320 may include comparing 8 bit frames of the configuration data against cyclic redundancy codes (CRCs) embedded in the configuration data bitstream. If no errors are detected, then DONE pin 322 is released (operation 322) which allows PLD 100 to wake up and the process of FIG. 3 will end with PLD 100 operating in accordance with the newly loaded configuration data (operation 324). However, if an error is detected during operation 320, then the process proceeds to operation 326 where counter 114 is incremented.

Thereafter, in operation 328, PLD 100 will determine whether the value of counter 114 is greater than one. As previously discussed, the value of counter 114 is set to zero in operation 304. Accordingly, if operation 326 has been performed only once, then the value of counter 114 will be equal to one and the process will continue on to operation 330. However, if operation 326 has been performed more than once, then the value of counter 114 will be greater than one. In such case, the process will proceed to operation 338 where SPI controller 102 drives INITN pin 126 low, and the process of FIG. 3 will end (operation 340).

In operation 330, SPI controller 102 sends another plurality of signals to SPI memory 210 which include a chip select signal, a read opcode, and a memory address corresponding to the beginning of Block 0. As previously described, Block 0 of SPI memory 210 may hold JUMP command 212 which references Block X where golden boot data 216 is stored. Alternatively, in an embodiment where SPI memory 200 of FIG. 2A is used in place of SPI memory 210, Block 0 may hold golden boot data 202, and no JUMP command is used.

Following operation 330, SPI controller 102 attempts to read in the contents of Block 0 from SPI memory 210 (operation 332) and the process then returns to operation 308. In this second iteration of operation 308, SPI controller 102 attempts to detect whether a configuration data preamble has been received from SPI memory 210 in response to previous read operation 332. If no preamble is detected, then SPI controller 102 may proceed to operation 310 as previously described herein. If a valid preamble is detected (operation 308), then SPI controller 102 will determine whether the data received in response to previous read operation 332 corresponds to a JUMP command. It will be appreciated that because Block 0 contains JUMP command 212, the process will proceed to operation 334.

In operation 334, SPI controller 102 sends a further plurality of signals to SPI memory 210 which include a chip select signal, a read opcode, and a memory address corresponding to the beginning of Block X (which may be included in the JUMP command read in previous operation 332). Accordingly, following operation 334, PLD 100 may attempt to read in golden boot data 216 (also labeled Root Data) from SPI memory 210 (operation 336) and then return to operation 308.

In this third iteration of operation 308, SPI controller 102 detects whether a configuration data preamble has been received from SPI memory 210 in response to previous read operation 336. Again, if no preamble is detected, then SPI controller 102 may proceed to operation 310 as previously described herein. If a valid preamble is detected (operation 308), then SPI controller 102 will determine whether the data read in previous operation 336 corresponds to a JUMP command. As indicated in FIG. 3, Block X contains valid golden boot data 216. As a result, PLD 100 will attempt to configure itself using the newly loaded golden boot data 216 (operation 318). If the configuration is successful (operation 320), then the process of FIG. 3 continues on to operations 322 and 324 as previously described herein.

If an error is detected in golden boot data 216 (operation 320), then counter 114 will be incremented to now exhibit a value of two. Thereafter, when counter 114 is evaluated in operation 328, the process will proceed to operations 338 and 340 as previously described herein.

In view of the foregoing, it will be appreciated that PLD 100 may be configured with primary boot data 214 or, in the case of a detected error, with golden boot data 216 referenced by JUMP command 212. It will further be appreciated that where SPI memory 200 is used in place of SPI memory 210, golden boot data 202 may be loaded directly from Block 0 of SPI memory 200.

Figure 4A:
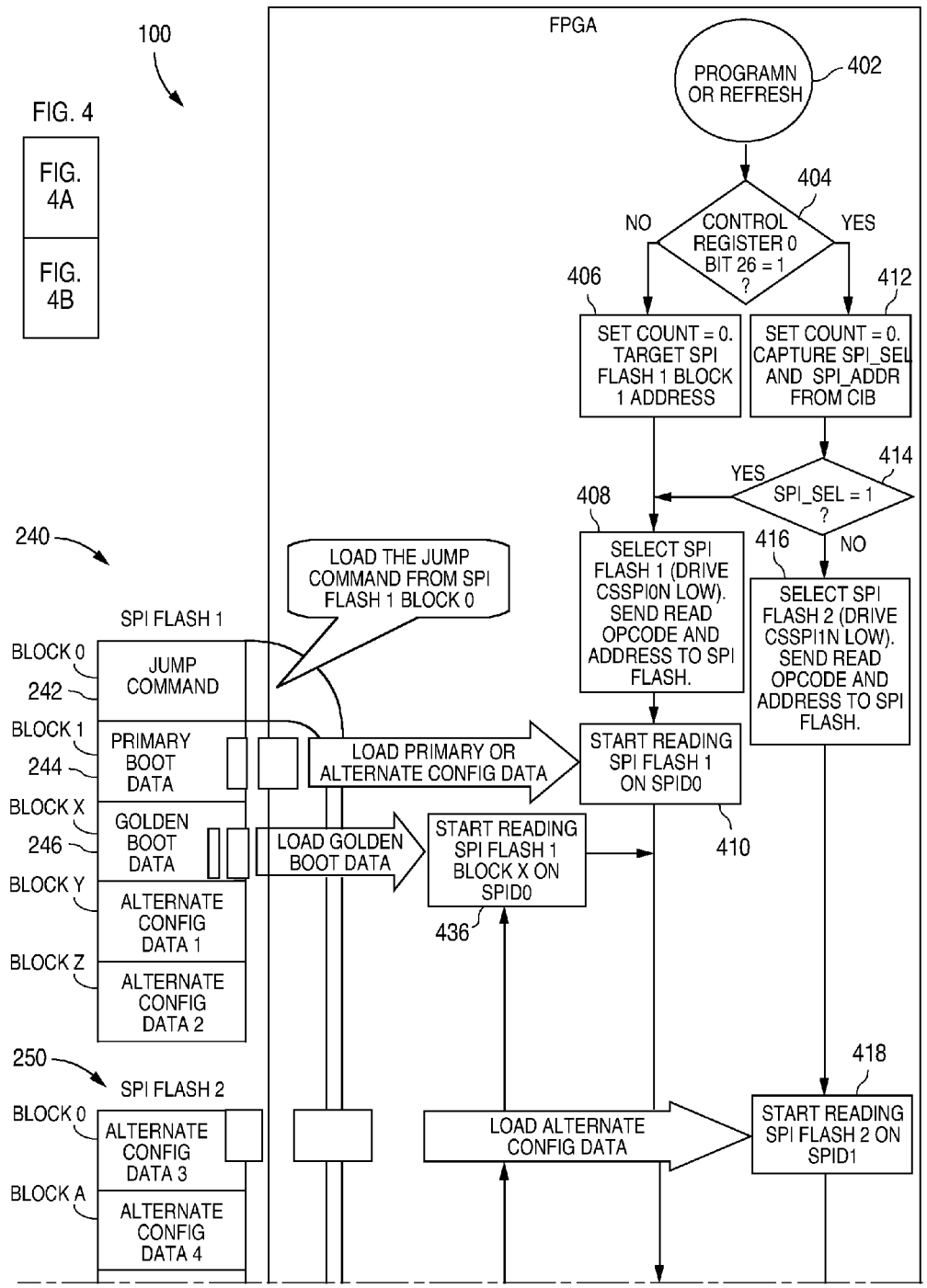
FIG. 4 illustrates a process of loading configuration data into the PLD of FIG. 1 in response to the toggling of a pin or the receipt of an appropriate instruction in accordance with an embodiment of the present invention.
Figure 4B:
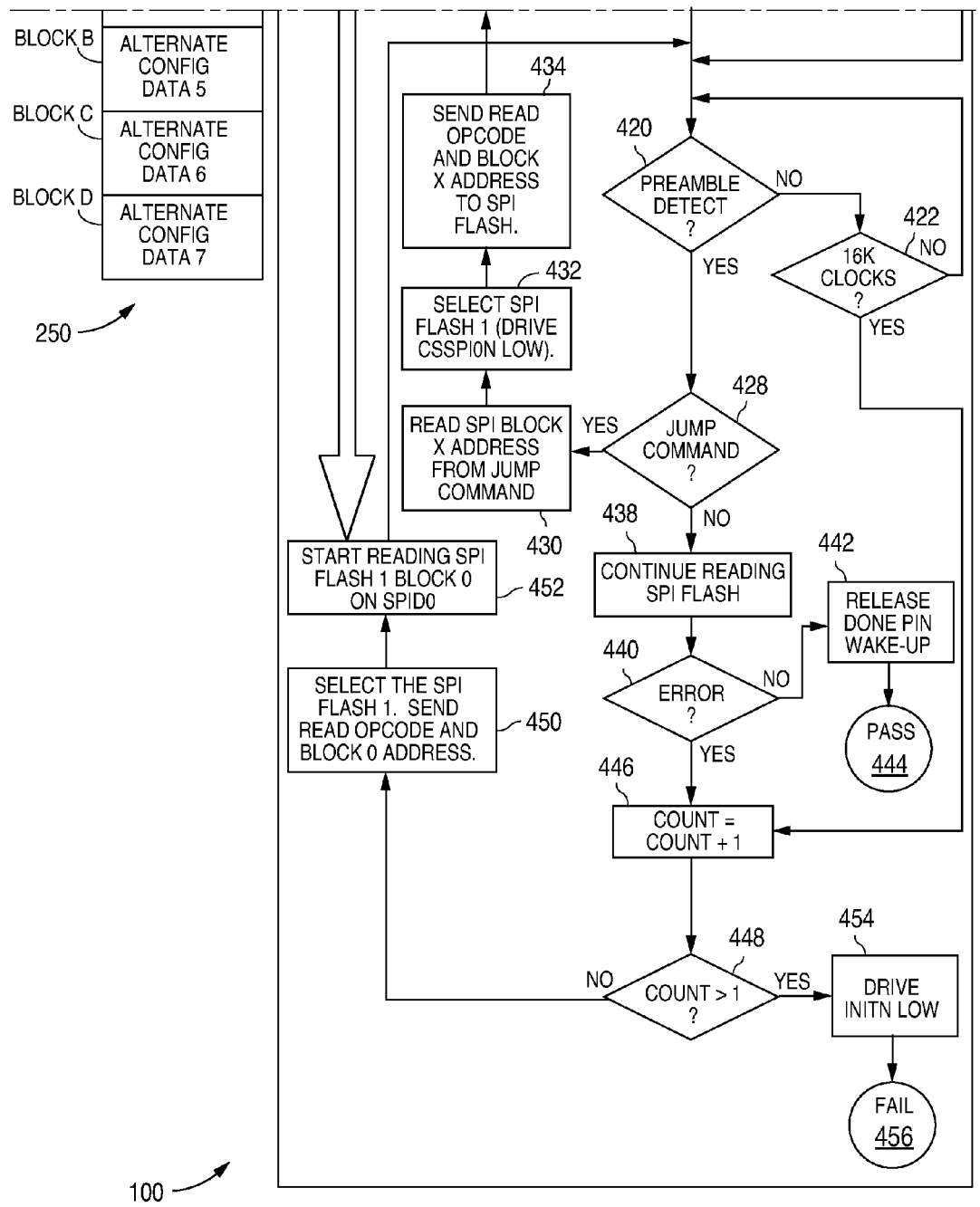

FIG. 4 illustrates a process of loading configuration data into PLD 100 in response to the toggling of PROGRAMN pin 122 or the receipt of an appropriate JTAG instruction in accordance with an embodiment of the present invention. Similar to FIG. 3, FIG. 4 sets forth an iterative process that may be implemented by PLD 100 to attempt the loading of appropriate configuration data from particular memory blocks of SPI memory 240 or 250. Advantageously, the particular memory blocks read by PLD 100 in FIG. 4 may also be specified by user logic 106. Although the process of FIG. 4 will be described with reference to SPI memories 240 and 250, it will be appreciated that SPI memories 220 and 230 of FIG. 2C may be used in an alternate embodiment.

In initial operation 402, PROGRAMN pin 122 is toggled or a JTAG refresh instruction 116 is received by PLD 100 to trigger an attempted loading of configuration data into configuration memory 150 of PLD 100. It will be appreciated that prior to the performance of operation 402, configuration data may have been previously loaded into PLD 100 in accordance with FIG. 3 described above. In one embodiment, the value of the control bit (i.e., bit 26) of control register 104 may be determined by such configuration data. For example, the value of the control bit may be set by a user in primary boot data 244 and/or golden boot data 246 previously loaded into PLD 100 and programmed in accordance with the process of FIG. 3. In this regard, the control bit of control register 104 may be used to determine from which memory block configuration data is loaded in response to operation 402.

In operation 404, the control bit of control register 104 may be evaluated. If the control bit corresponds to a first logic state (e.g., a "0" value), then PLD 100 will attempt to load primary boot data 244 from Block 1 of SPI memory 240. In this case, counter 114 is set to zero and SPI controller 102 determines the address of Block 1 of SPI memory 240 (operation 406). SPI controller 102 then provides SPI memory 240 with a chip select signal, a read opcode, as well as the memory address determined in operation 406 (operation 408). Following operation 408, PLD 100 attempts to read in primary boot data 244 from SPI memory 240 (operation 410).

Referring again to operation 404, if the control bit of control register 104 corresponds to a second logic state (e.g., a "1" value), then PLD 100 will attempt to load configuration data from a memory block specified by the values of SPI_SEL signal 110 and SPI_ADDR bus 112 which are provided by user logic 106. In this regard, SPI_SEL signal 110 may determine whether configuration data is loaded from SPI memory 240 or 250. For example, if SPI_SEL signal 110 corresponds to a first logic state (e.g., a "0" value), then SPI memory 250 may be selected. Alternatively, if SPI_SEL signal 110 corresponds to a second logic state (e.g., a "1" value), then SPI memory 240 may be selected. SPI_ADDR bus 112 may specify the address of a particular memory block of SPI memory 240 or 250 from which configuration data is to be loaded. In one embodiment, SPI_ADDR bus 112 may be implemented as an 8-bit bus. In such an embodiment, the 8-bit address provided by SPI_ADDR bus 112 may correspond to the most significant bits of a desired memory block of SPI memory 240 or 250. For example, if the memory blocks are implemented as 512 K blocks, the 8-bit address provided by SPI_ADDR bus 112 may correspond to the 8 most significant bits of a 24-bit address.

Accordingly, in operation 412, counter 114 will be set to zero and SPI controller 102 will capture the values of SPI_SEL signal 110 and SPI_ADDR bus 112. If SPI_SEL signal 110 corresponds to a 1 value, then operations 408 and 410 are performed using the memory address captured in previous operation 412. As a result, SPI controller 102 will attempt to read the alternate configuration data (also labeled Alternate Config Data) stored in the particular memory block of SPI memory 240 that corresponds to the address provided to SPI_ADDR bus 112 by user logic 106.

If, in operation 414, SPI_SEL signal 110 corresponds to a 0 value, then the process proceeds to operation 416 where SPI controller 102 provides SPI memory 250 with a chip select signal, a read opcode, and the memory address determined in operation 412. In operation 418, SPI controller 102 attempts to read in the configuration data (i.e., alternate configuration data) stored in the particular memory block of SPI memory 250 corresponding to the address previously captured in operation 412.

In operation 420, SPI controller 102 detects whether a configuration data preamble has been received from SPI memory 240 in response to previous operation 410 or from SPI memory 250 in response to previous operation 418. If no preamble is detected, then SPI controller 102 continues to wait for up to 16K clock cycles (operation 422) until a valid preamble is received. If no preamble is received, then SPI controller 102 may assume that SPI memory 240 or 250 is erased or non-responsive. As a result, the process of FIG. 4 will continue on to operation 446 further described herein.

However, if a valid preamble is detected in operation 420, then SPI controller 102 will next determine whether the data read in previous operation 410 or 418 corresponds to a JUMP command (operation 428). If no JUMP command is found, then the process of FIG. 4 will continue on to operation 438. If a JUMP command is detected in operation 420, then the process will proceed to operation 430 as further described herein.

In operation 438, PLD 100 continues reading configuration data from the particular memory block specified in previous operation 410 or 418, and begins configuring PLD 100 by programming configuration memory 150 with the configuration data. In operation 440, PLD 100 checks the incoming configuration data for errors in the manner previously described in relation to operation 320 of FIG. 3. If no errors are detected, then DONE pin 128 is released (operation 442) which allows PLD 100 to wake up and the process of FIG. 4 will end with PLD 100 operating in accordance with the newly loaded configuration data (operation 444). However, if an error is detected during operation 440, then the process proceeds to operation 446 where counter 114 is incremented.

Thereafter, in operation 448, PLD 100 will determine whether the value of counter 114 is greater than one. As previously discussed, the value of counter 114 is set to zero in either operation 406 or 412. Accordingly, if operation 446 has been performed only once, then the value of counter 114 will be equal to one and the process will continue on to operation 450. However, if operation 446 has been performed more than once, then the value of counter 114 will be greater than one. In such case, the process will proceed to operation 454 where SPI controller 102 drives INITN pin 126 low and the process of FIG. 4 will end (operation 456).

In operation 450, SPI controller 102 provides SPI memory 240 with a chip select signal, a read opcode, and a memory address corresponding to the beginning of Block 0. Following operation 450, PLD 100 attempts to read in the contents of Block 0 from SPI memory 240 (operation 452) and then returns to operation 420. In this second iteration of operation 420, SPI controller 102 detects whether a configuration data preamble has been received from SPI memory 240 in response to previous read operation 452. If no preamble is detected, then SPI controller 102 may proceed to operation 422 as previously described herein.

If a valid preamble is detected (operation 420), then SPI controller 102 will determine whether the data read in previous read operation 452 corresponds to a JUMP command. As previously described, Block 0 of SPI memory 240 may hold JUMP command 242 which references Block X where golden boot data 246 is stored. Alternatively, in an embodiment where SPI memories 220 and 230 of FIG. 2C are used in place of SPI memories 240 and 250, Block 0 may hold golden boot data 222, and no JUMP command is used. If no JUMP command is detected (operation 428), then the process of FIG. 4 may continue on to operation 438 and subsequent operations as previously described herein. However, if Block 0 contains JUMP command 242, the process will proceed to operation 430.

In operation 430, SPI controller 102 reads the address of Block X of SPI memory 240 from JUMP command 242 previously read from Block 0 in operation 452. SPI controller 102 then provides a chip select signal to SPI memory 240 (operation 432), sends a read opcode and the memory address of Block X to SPI memory 240 (operation 434), and attempts to read in golden boot data 246 from Block X of SPI memory 240 (operation 436). The process then returns to operation 420.

In this third iteration of operation 420, SPI controller 102 detects whether a configuration data preamble has been received from SPI memory 240 in response to previous read operation 436. Again, if no preamble is detected, then SPI controller 102 may proceed to operation 422 as previously described herein. If a valid preamble is detected (operation 420), then SPI controller 102 will determine whether the data read in previous operation 436 corresponds to a JUMP command. As indicated in FIG. 4, Block X contains golden boot data 246. As a result, PLD 100 will again attempt to configure itself using the newly loaded golden boot data 246 (operation 438). If the configuration is successful (operation 440), then the process of FIG. 4 continues on to operations 442 and 444 as previously described herein.

If an error is detected in golden boot data 246 (operation 440), then counter 114 will again be incremented to exhibit a value of two. Thereafter, when counter 114 is evaluated in operation 448, the process will proceed to operations 454 and 456 as previously described herein.

In view of the foregoing, it will be appreciated that one or more of the various techniques described herein can be utilized to selectively load configuration data from various memory blocks of a plurality of SPI memories. Advantageously, PLD 100 can be implemented to load default configuration data (i.e., golden boot data) in the event that primary boot data and/or one or more alternate configuration data patterns are corrupted, erased, or otherwise unavailable. Reconfiguration of PLD 100 may also be performed using configuration data read from a particular memory block selected by user logic.

Embodiments described above illustrate but do not limit the invention. It should also be understood that numerous modifications and variations are possible in accordance with the principles of the present invention. Accordingly, the scope of the invention is defined only by the following claims.

We claim:

1. A method of configuring a programmable logic device having volatile configuration memory, the method comprising:
   reading a first bitstream from a first memory block of non-volatile memory;
   detecting whether the first bitstream contains a valid preamble as the first bitstream is read from the non-volatile memory and before configuration data in the first bitstream is programmed into the volatile configuration memory;
   if a valid preamble is detected in the first bitstream, programming the volatile configuration memory with configuration data in the first bitstream; and
   if a valid preamble is not detected in the first bitstream, reading a second bitstream from a second memory block of the non-volatile memory.

2. The method of claim 1 including:
   detecting whether the second bitstream contains a valid preamble as the second bitstream is read from the non-volatile memory and before configuration data in the second bitstream is programmed into the volatile configuration memory; and
   programming the volatile configuration memory with configuration data in the second bitstream if a valid preamble is detected in the second bitstream.

3. The method of claim 1, wherein a valid preamble is determined not detected in the first bitstream when no valid preamble is received from the first bitstream a certain number of clock cycles after the detecting is initiated.

4. The method of claim 1 including:
   if a valid preamble is detected in the first bitstream:
      checking the first bitstream for errors as the configuration data is programmed into the volatile configuration memory; and
      if an error is detected by the checking of the first bitstream, reading the second bitstream from the second memory block of the non-volatile memory.

5. The method of claim 1, wherein the first bitstream comprises primary boot data and the second bitstream comprises default boot data for the programmable logic device.

6. The method of claim 1, wherein if a valid preamble is not detected in the first bitstream:
   prior to reading of the second bitstream, reading a third bitstream from a third memory block of the non-volatile memory, wherein the third bitstream contains a jump command to the address of the second memory block;
   detecting whether the third bitstream contains a valid preamble as the third bitstream is read from the non-volatile memory and before executing the jump command; and
   executing the jump command if a valid preamble is detected in the third bitstream.

7. The method of claim 1, wherein the method is performed in response to one of a powering up of the programmable logic device and an instruction received by the programmable logic device.

8. The method of claim 1, wherein the non-volatile memory is an external memory device.

9. A programmable logic device comprising:
  configuration memory adapted to store configuration data to configure the programmable logic device for its intended function; and
  a controller adapted to:
    read a first bitstream from a first memory block of non-volatile memory;
    detect whether the first bitstream contains a valid preamble as the first bitstream is read from the non-volatile memory and before configuration data in the first bitstream is programmed into the volatile configuration memory;
    program the volatile configuration memory with configuration data in the first bitstream if a valid preamble is detected in the first bitstream; and
    read a second bitstream from a second memory block of the non-volatile memory if a valid preamble is not detected in the first bitstream.

10. The programmable logic device of claim 9, wherein the controller is further adapted to determine that a valid preamble is not detected in the first bitstream when no valid preamble is received from the first bitstream a certain number of clock cycles after the detecting is initiated.

11. The programmable logic device of claim 9, wherein the controller is further adapted to:
  detect whether the second bitstream contains a valid preamble as the second bitstream is read from the non-volatile memory and before configuration data in the second bitstream is programmed into the volatile configuration memory; and
  program the volatile configuration memory with configuration data in the second bitstream if a valid preamble is detected in the second bitstream.

12. The programmable logic device of claim 9, wherein the controller is further adapted to:
  if a valid preamble is detected in the first bitstream, check the first bitstream for errors as the configuration data is programmed into the volatile configuration memory; and
  if an error is detected by the checking of the first bitstream, read the second bitstream from the second memory block of the non-volatile memory.

13. The programmable logic device of claim 9, wherein the controller is further adapted to:
  prior to reading the second bitstream, read a third bitstream from a third memory block of the non-volatile memory, wherein the third bitstream contains a jump command to the address of the second memory block;
  detect whether the third bitstream contains a valid preamble as the third bitstream is read from the non-volatile memory and before executing the jump command; and
  execute the jump command if a valid preamble is detected in the third bitstream.

14. The programmable logic device of claim 9, wherein the non-volatile memory is an external memory device.

15. The programmable logic device of claim 9, wherein the controller is a bus interface controller.

* * * * *